United States Patent [19]

Nielsen, Jr.

[11] 4,413,490
[45] Nov. 8, 1983

[54] FRONT ENTRY LOCKING RING ASSEMBLY

[75] Inventor: Anker J. Nielsen, Jr., Holden, Mass.

[73] Assignee: Omco Inc., Holden, Mass.

[21] Appl. No.: 353,591

[22] Filed: Mar. 1, 1982

[51] Int. Cl.³ .............................................. B65D 55/14
[52] U.S. Cl. ....................................... 70/164; 70/232; 70/DIG. 57
[58] Field of Search ................. 70/163, 164, 166, 167, 70/168, 170, 171, 172, 229, 232, DIG. 57; 292/256.6, 256.67

[56] References Cited

U.S. PATENT DOCUMENTS

| 4,158,953 | 6/1979 | Nielsen | 70/164 |
| 4,254,647 | 3/1981 | Finck | 70/164 |
| 4,329,860 | 5/1982 | Moberg | 70/164 |

Primary Examiner—Robert L. Wolfe
Attorney, Agent, or Firm—Thompson, Birch, Gauthier & Samuels

[57] ABSTRACT

A front entry meter locking ring assembly for locking electric meters. A circular split locking ring has a U-shaped cross-section and two downturned parallel legs of equal length. A take-up fastener engages and draws the downturned legs towards each other. A lock receptacle having a hollow cylindrical portion is affixed to the interior of one downturned leg. A removable protective housing is fitted over the downturned legs and has a front aperture in axial alignment with the front opening of the lock receptacle. An unlocked conventional barrel lock is inserted into the front aperture of the housing. Then the barrel lock is locked. This radially extends the locking balls of the barrel lock into secure engagement with the lock receptacle. An elongated sealing tab is fixed within the housing by the take-up fastener. The sealing tab extends down through a narrow slot in the bottom of the housing where the tab is engaged by a tell-tale seal.

10 Claims, 10 Drawing Figures

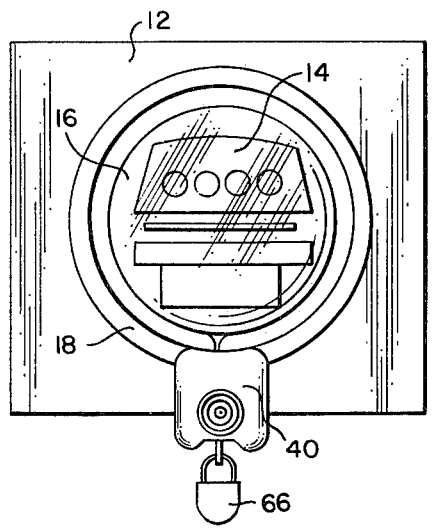
Fig. 1
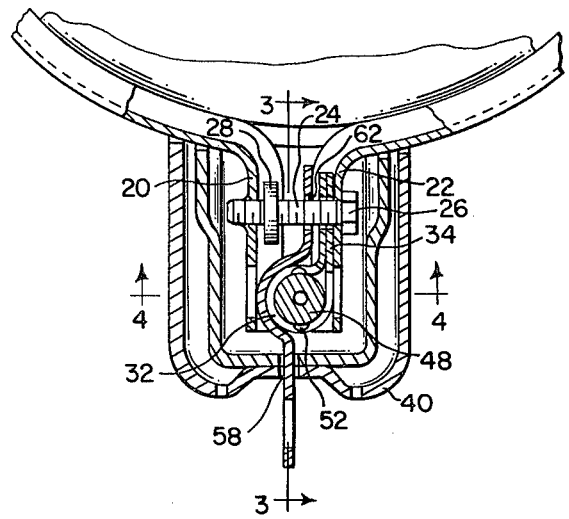
Fig. 2
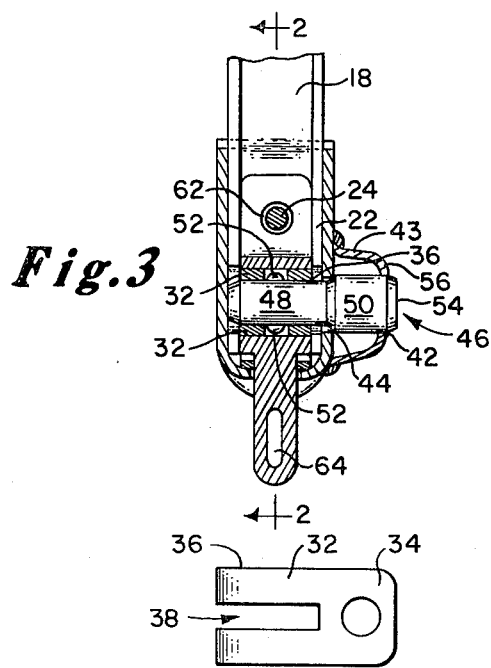
Fig. 3
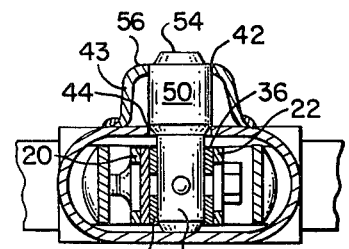
Fig. 4
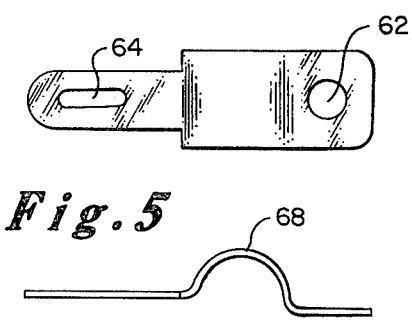
Fig. 5
Fig. 6
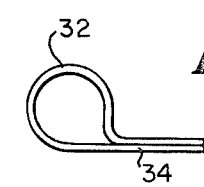
Fig. 8
Fig. 9
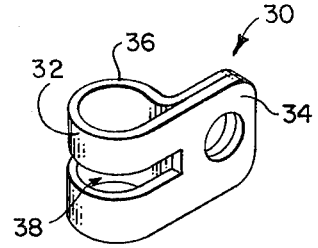
Fig. 10
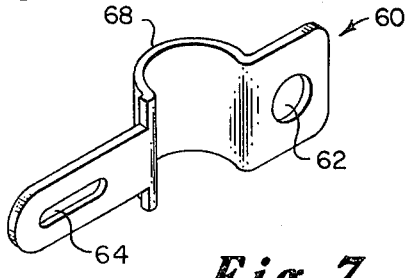
Fig. 7

FRONT ENTRY LOCKING RING ASSEMBLY

BACKGROUND OF THIS INVENTION

This invention is an improvement over the inventor's prior U.S. Pat. No. 4,158,953 which issued on June 26, 1979. The patented device utilized a split locking ring having one long downturned leg and one short downturned leg. This difference in leg lengths was necessary because the lock receptacle shown in the patent was rather large, had a complicated shape, and could not be accommodated between two equal-sized legs. However, because of the unequal-sized legs, the installer had difficulty manually squeezing the two legs together with one hand when inserting the take-up fastener between the down-turned leg holes with the other hand.

Also, the patented device had a guide sleeve mounted within the conical bushing in the front aperture of the housing. The guide sleeve supported and guided the head portion of the barrel lock. In the field, vandals often smashed these guide sleeves thereby covering the keyways of the locks which prevented authorized persons from inserting their keys into the locks.

Also, the patented lock receptacle proved difficult to fabricate and was relatively expensive to make. Similarly, the patented locking ring required a burdensome and expensive modification of the conventional locking ring which has downturned legs of equal length.

SUMMARY OF THE INVENTION

It is an object of this invention to provide a meter locking ring assembly which uses a conventional split locking ring which has legs of equal length. It is another object of this invention to provide an assembly which has a lock receptacle that is fabricated in an inexpensive and simple manner, yet has great strength.

It is another object of this invention to provide an assembly which has a protective housing that does not require a guide sleeve in its front entry aperture. Elimination of the prior art guide sleeve prevents vandals from smashing the guide sleeve over the lock's keyway.

It is another object of this invention to provide a sealing tab which is located away from the front entry aperture of the housing. This prevents vandals from jamming the tell-tale sleeve into or over the lock's keyway.

It is another object of this invention to provide a simpler assembly which is more economical to manufacture and is stronger and more secure in use.

The present invention is used with an electric meter and locks the split ring which clamps the glass bowl on the meter receptacle. The split locking ring has parallel downturned legs of equal lengths which are first manually drawn together and then fastened together by a take-up fastener which spans the two legs.

A d-shaped lock receptacle is welded to the interior of one downturned leg and has a hollow cylindrical portion whose axis through its front opening is parallel to the axis of the split locking ring. The lock receptacle cylindrical portion has a circular slot which acts as a barrel lock locking ball retaining means.

A protective housing is fitted over the downturned legs and has a front aperture which, in its locking position, is axially aligned with the lock receptacle front opening. An unlocked conventional barrel lock is inserted and seated through the front aperture of the housing and is then locked by a key so that its locking balls are extended radially and are engaged by the retaining means of the lock receptacle. The trailing face of the barrel lock head is approximately flush with the outer rim around the front aperture of the housing.

An elongated sealing tab is inserted between the legs of the split locking ring before the housing is pushed upwardly into its locking position. An aperture in the bottom of the housing permits the sealing tab to extend vertically down through the housing. The take-up fastener extends through an aperture in the upper portion of the sealing tab, and a tell-tale seal is affixed to the aperture in the lower outside portion of the sealing tab. Thus, the housing cannot be downwardly removed without destroying the tell-tale seal.

The housing, when locked by the barrel lock, prevents unauthorized access to the interior of the housing, and also renders ineffective malicious acts of vandalism.

DESCRIPTION OF THE DRAWINGS

FIG. 1 is a front elevation of the front entry meter locking ring assembly shown locked in place on an electric meter.

FIG. 2 is a sectional view taken along line 2—2 of FIG. 3. This view is taken in the same direction as FIG. 1.

FIG. 3 is a sectional view taken along line 3—3 of FIG. 2.

FIG. 4 is a sectional view taken along line 4—4 of FIG. 2.

FIG. 5 is a view of the elongated sealing tab.

FIG. 6 is an edge view of the elongated sealing tab shown in FIG. 5.

FIG. 7 is a perspective view of the elongated sealing tab shown in FIG. 5.

FIG. 8 is a view of the lock receptacle.

FIG. 9 is an edge view of the lock receptacle shown in FIG. 8.

FIG. 10 a perspective view of the lock receptacle shown in FIG. 8.

DESCRIPTION OF THE PREFERRED EMBODIMENT

This invention is an improvement over applicant's prior U.S. Pat. Nos. 4,158,953 and 3,867,822, the disclosures of which are incorporated herein and made a part of this disclosure.

FIG. 1 shows a conventional electric meter having a meter receptacle 12 supporting the meter mechanism (with recording dials) 14. The meter receptacle has a front aperture. To protect the meter mechanism, a glass bowl 16 is positioned against the meter receptacle so that their facing circular flanges mate. In order to hold the flange of the glass bowl 16 against the flange of the meter receptacle 12, a circular split locking ring 18, which has a U-shaped cross-section, is provided to encircle and to clamp the glass bowl to the meter receptacle. This is conventional.

Locking ring 18 has a circular portion which has a U-shaped cross-section as is best shown in FIGS. 2-3. Locking ring 18 also has two downturned legs 20 and 22 which have the same U-shaped cross-section and which are substantially parallel to each other. Downturned legs 20 and 22 are equal in length much like conventional split locking rings. Leg 22 has a smooth walled transverse aperture and leg 20 has a threaded transverse aperture, the two apertures being opposed and axially aligned to accommodate a threaded take-up fastener 24 which has a slotted hexagonal head 26 and a rubber washer 28 mounted on the fastener between the two downturned legs.

In order to clamp the glass bowl 16 securely against the meter receptacle 12, the legs of the split locking ring 18 are first slightly spread and then positioned over the facing mating flanges of the glass bowl and the meter receptacle. Then, the ends of the downturned legs 20, 22 of the locking ring are manually squeezed together with the fingers of one hand. The take-up fastener 24 is engaged into the aligned transverse apertures formed in the downturned legs and the legs are drawn together by turning the take-up fastener 24 until the locking ring is snug around the mating flanges of the glass bowl and the meter receptacle.

The locking ring 18 is preferably case-hardened to resist cutting or hacksawing. The ring is also preferably plated with cadmium and chromate for corrosion resistance.

The fact that downturned legs 20, 22 are the same length gives the preferred embodiment a considerable advantage over the patented device which has one long leg and one short leg (see applicant's U.S. Pat. No. 4,158,953). This advantage is that the installer can use one hand to squeeze the opposed ends of the downturned legs together as he inserts take-up fastener 24 into the threaded aperture in leg 20. Also, the conventional split ring, which has downturned legs of equal length, can be used in this invention, without significant modification.

A lock receptacle 30 is shown in FIGS. 8-10 and is made from a single piece of metal strip which is stamped, rolled and then folded back on itself to form a d-shape as is clearly shown in FIGS. 2 and 9. Lock receptacle 30 has a hollow cylindrical body portion 32 and flat mounting portion 34. The flat mounting portion 34 of the lock receptacle 30 is affixed, as by being spot welded, to the interior of downturned leg 22. This is best shown in FIG. 2. The axis of hollow cylindrical body portion 32 is parallel to and vertically beneath the axis of locking ring 18. Cylindrical body portion 32 has a round front opening 36 and has an interior locking ball retaining means 38 consisting a circular slot which is slightly wider than the diameter of the locking balls of a conventional barrel lock.

A removable, substantially unbreakable, housing 40 is provided and is quite similar to the housing shown in U.S. Pat. No. 4,158,953. However, housing 40 does not have a guide sleeve and does have a different type of barrel lock head collar. Housing 40 has case hardened walls and an inner liner which is welded to the bottom wall of the housing. The purpose of the inner liner is to stiffen the housing walls and to prevent a prying tool from reaching the downturned legs of the locking ring. The housing is preferably plated for corrosion resistance.

Housing 40 is sized and shaped to enclose and securely shield the locking ring downturned legs 20, 22, as well as the other elements which are attached to the legs from unauthorized access by thieves or vandals. The housing is moved upwardly into its locking position by being fitted over the locking ring legs until the housing contacts the lower circumference of the locking ring circular portion as shown in FIG. 2. In this locking position, the round front aperture 42 in the barrel lock head collar 43 of the housing 40 is in axial alignment with the lock receptacle round front opening 36 as well as with the round interior aperture 44 formed in the wall of housing 40.

When the housing 40 is in its locking position, as shown in FIGS. 1-4, a conventional unlocked barrel lock 46 can be inserted through housing apertures 42, 44 and into lock receptacle front opening 36. As can be best seen in FIG. 3, lock receptacle front opening 36 has a diameter slightly larger than the barrel portion 48 as does the round interior aperture 44 of the housing. The round front aperture 42 has a diameter which is slightly larger than the head 50 of the barrel lock so that the barrel lock 46 can be inserted only until head 50 seats against round interior aperture 44 which has a smaller diameter. This locates locking balls 52 in the same vertical plane with locking ball retaining means 38 so that when the barrel lock is locked, the locking balls 52 extend radially and are confined within slot 38 such that barrel lock 46 cannot be pulled axially from its locked position (shown in the drawings).

It will be seen that the rear face 54 of barrel lock 46 is substantially flush with the outer rim 56 around the housing front aperture 42 to substantially prevent malicious deformation of the very strong collar over the rear face 54 of the locked barrel lock such as sometimes happened to the guide sleeve when the device shown in U.S. Pat. No. 4,158,953 was used.

Housing 40 also has a bottom aperture (or slot) 58 for accommodating an elongated sealing tab 60 shown in FIGS. 5-7. Instead of being transversely inserted through a guide sleeve near the head of the barrel lock, sealing tab 60 extends substantially vertically through housing bottom aperture 58. Tab 60 has an upper portion in which an upper aperture 62 is formed. Sealing tab 60 also has a lower portion in which a lower aperture 64 is formed. Preferably, upper aperture 62 receives take-up fastener 24 which fixes the tab against downward movement relative to the downturned legs 20, 22. Lower aperture 64 receives a conventional telltale seal 66 which is larger than housing bottom slot 58. The purpose of seal 66 is to prevent the downward removal of housing 40 without the destruction of the seal 66. Thus, unauthorized removal of the housing will be readily apparent to the authorities.

Tab 60 has a rounded central portion 68 which is shaped to conform to the shape of the hollow cylindrical portion 32 of lock receptacle 30 (see FIG. 2). The side walls of the downturned legs 20, 22 are also notched to provide a clear path for the barrel 48 into and within cylindrical portion 30 of the lock receptacle. This is best shown in FIG. 3.

To install the assembly on an electric meter, the installer first checks to see if take-up fastener 24 is inserted through the smooth-walled aperture in leg 22, and that fastener 24 is inserted through upper aperture 62 of tab 60, and that rubber washer 28 holds tab 60 on fastener 24. Then, the installer manually spreads downturned legs 20 and 22, slips locking ring 18 over the facing flanges of the glass bowl and the meter receptacle, and then manually draws the downturned legs together with one hand while pushing the leading end of fastener 24 into the threaded aperture in downturned leg 20 with the other hand. Using a screwdriver or socket wrench, the slotted hex head 26 of the fastener 24 is then turned snugly to draw the two legs towards each other.

The housing 40 is then passed up over the downturned legs 20, 22 until the housing reaches its locking position against the lower circumference of the locking ring 18. In this locking position, the front entry round aperture 42 of the housing is axially aligned with lock receptacle front opening 36.

A security key is then inserted into the keyway of a conventional (or shortened) barrel lock 46. The key is operated to unlock the barrel lock which is then inserted and pushed into housing aperture 42 as far as possible until the barrel lock seats. The barrel lock is then locked by the security key and the key is removed. The locking operation forces the locking balls 52 radially into lock receptacle slot 38 preventing axial movement of the barrel lock 46 and thereby preventing downward movement of the housing 40. The locking ring 18 is now securely locked and shielded. Affixing a tell-tale seal 66 to the lower aperture 64 of tab 60 completes the installation. To remove the locking ring, the installation process is substantially reversed.

The above description obviously suggests many possible variations and modifications of this invention which would not depart from its spirit and scope. It should be understood, therefore, that the invention is not limited in its application to the details of structures specifically described or illustrated and that, within the scope of the appended claims, it may be practiced otherwise than as specifically described or illustrated.

I claim:

1. A front entry meter locking ring assembly for locking electric meters and the like comprising:
   (a) a split locking ring having a U-shaped cross-section, said locking ring having a circular portion adapted to clamp the glass bowl flange to the meter receptacle flange;
   (b) said locking ring having two substantially parallel downturned legs, said legs being substantially equal in length for ease of being manually squeezed together during initial positioning and fastening of said locking ring over the flanges of the glass bowl and the meter receptacle, said downturned legs having U-shaped cross-sections and having opposed and aligned apertures through which is mounted a take-up fastener for drawing said two legs towards each other;
   (c) a lock receptacle affixed to the interior of one of said legs, said lock receptacle having a hollow cylindrical body which has an axis which is parallel to the axis of said circular portion of said locking ring, said lock receptacle cylindrical body having a round front opening and having interior locking ball retaining means for permitting the insertion of an unlocked barrel lock and for preventing the withdrawal of a locked barrel lock;
   (d) a removable substantially unbreakable housing for enclosing and securely shielding said locking ring legs and their associated elements against unauthorized entry, said housing adapted to be moved into its locking position by being fitted over said locking ring legs and positioned closely adjacent to the lower circumference of said locking ring circular portion, said housing when in its locking position having a round front aperture in axial alignment with said lock receptacle round front opening, said housing front aperture being sized and shaped to accept with a relatively close fit the full insertion of a barrel lock, the rear face of the inserted barrel lock being relatively flush with the outer rim of said housing front aperture thereby substantially preventing malicious deformation of said housing over the rear face of a locked barrel lock, said housing also having a bottom aperture; and
   (e) an elongated sealing tab extending substantially vertically through said housing bottom aperture when said housing is in its locking position, retaining means for fixing said sealing tab against downward movement relative to said locking ring, and a tell-tale seal affixed to said sealing tab below said housing bottom aperture, said tell-tale seal sized and shaped sufficiently large to prevent undetectable passage of said housing bottom aperture over it.

2. The assembly of claim 1 wherein said two locking ring downturned legs are equal in length.

3. The assembly of claim 1 wherein said lock receptacle is a single length of metal strip which has been rolled into a hollow cylinder at its lower portion and has been folded back upon itself at its upper portion to form an approximate d-shape.

4. The assembly of claim 3 wherein said lock receptacle strip lower portion has a circular slot forming said locking ball retaining means.

5. The assembly of claims 3 or 4 wherein said lock receptacle strip is welded to the interior of one of said locking ring downturned legs.

6. The assembly of claims 3 or 4 wherein said lock receptacle strip upper portion has an upper aperture through which said take-up fastener extends.

7. The assembly of claims 3 or 4 wherein said sealing tab is a single length of metal strip which has been rolled into a shape having a flat upper portion, a C-shaped central portion, and a flat lower portion, said central portion having an inside radius approximately the same as the outside radius of said lock receptacle hollow cylindrical body.

8. The assembly of claim 7 wherein said sealing tab has an aperture in its upper portion and an aperture in its lower portion.

9. The assembly of claim 8 wherein said sealing tab is positioned next to said lock receptacle, said sealing tab upper portion being positioned next to said lock receptacle upper portion and said sealing tab central portion being positioned next to said lock receptacle hollow cylindrical body.

10. The assembly of claim 9 wherein said take-up fastener passes through said sealing tab upper portion aperture and said tell-tale seal is passed through said sealing tab lower portion aperture.

* * * * *